(12) United States Patent
Lee et al.

(10) Patent No.: US 8,228,069 B2
(45) Date of Patent: Jul. 24, 2012

(54) TEST APPARATUS FOR DETERMINING IF ADJACENT CONTACTS ARE SHORT-CIRCUITED AND SEMICONDUCTOR INTEGRATED CIRCUIT DEVICES THAT INCLUDE SUCH TEST APPARATUS

(75) Inventors: Sun-Jung Lee, Seoul (KR); Hong-Jae Shin, Seoul (KR)

(73) Assignee: Samsung Electronics Co., Ltd. (KR)

( * ) Notice: Subject to any disclaimer, the term of this patent is extended or adjusted under 35 U.S.C. 154(b) by 589 days.

(21) Appl. No.: 12/344,024

(22) Filed: Dec. 24, 2008

(65) Prior Publication Data

US 2009/0167319 A1 Jul. 2, 2009

(30) Foreign Application Priority Data

Dec. 27, 2007 (KR) .................. 10-2007-0138822

(51) Int. Cl.
*G01R 31/08* (2006.01)
(52) U.S. Cl. .............. 324/522; 324/750.1; 324/750.074; 365/149; 365/163; 365/201; 365/230.06; 257/48
(58) Field of Classification Search .................. 324/522
See application file for complete search history.

(56) References Cited

U.S. PATENT DOCUMENTS

| | | | | |
|---|---|---|---|---|
| 5,371,712 A * | 12/1994 | Oguchi et al. | ........... | 365/230.06 |
| 5,968,191 A * | 10/1999 | Thatcher et al. | .............. | 714/723 |
| 6,137,713 A * | 10/2000 | Kuroda et al. | ................ | 365/149 |
| 6,261,956 B1 * | 7/2001 | Shields | ........................ | 438/689 |
| 7,061,264 B2 * | 6/2006 | Kang et al. | ............... | 324/750.11 |
| 7,528,452 B2 * | 5/2009 | Sugimae et al. | .............. | 257/390 |
| 7,570,512 B2 * | 8/2009 | Chang | ............................ | 365/163 |
| 2004/0076056 A1 * | 4/2004 | Chang et al. | ................... | 365/201 |
| 2004/0239349 A1 * | 12/2004 | Yamagishi et al. | ........... | 324/754 |
| 2005/0272174 A1 * | 12/2005 | Duan et al. | ...................... | 438/18 |
| 2006/0077702 A1 * | 4/2006 | Sugimae et al. | ................. | 365/63 |
| 2006/0138411 A1 * | 6/2006 | Lachenmann et al. | .......... | 257/48 |
| 2006/0255817 A1 * | 11/2006 | Yamagishi | ..................... | 324/754 |
| 2007/0210306 A1 * | 9/2007 | Molinelli Acocella et al. | | 257/48 |
| 2007/0236244 A1 * | 10/2007 | Ando | ............................ | 324/770 |
| 2008/0026638 A1 * | 1/2008 | Cohen et al. | ................... | 439/608 |
| 2010/0060292 A1 * | 3/2010 | De Vries et al. | .............. | 324/537 |

FOREIGN PATENT DOCUMENTS

JP 05-144917 6/1993
KR 1020020052691 A 7/2002

* cited by examiner

*Primary Examiner* — Timothy J Dole
*Assistant Examiner* — Benjamin M Baldridge
(74) *Attorney, Agent, or Firm* — Myers Bigel Sibley & Sajovec (57) ABSTRACT

A test apparatus includes a plurality of pairs of test contacts on a semiconductor substrate; a first test structure which includes a plurality of first test interconnection layers and a first body interconnection layer that is electrically connected to the first test interconnection layers, each of the first test interconnection layers being electrically connected to at least one test contact; and a second test structure which includes a plurality of second test interconnection layers and a second body interconnection layer that is electrically connected to the second test interconnection layers, each of the second test interconnection layers being electrically connected to at least one test contact.

17 Claims, 7 Drawing Sheets

TEST APPARATUS FOR DETERMINING IF ADJACENT CONTACTS ARE SHORT-CIRCUITED AND SEMICONDUCTOR INTEGRATED CIRCUIT DEVICES THAT INCLUDE SUCH TEST APPARATUS

CROSS-REFERENCE TO RELATED APPLICATION

This application claims priority under 35 U.S.C. §119 from Korean Patent Application No. 10-2007-0138822 filed on Dec. 27, 2007 in the Korean Intellectual Property Office, the disclosure of which is incorporated herein by reference in its entirety.

FIELD OF THE INVENTION

The present invention relates to a test apparatus and a semiconductor integrated circuit (IC) device, and, more particularly, to a test apparatus and a semiconductor IC device which can improve productivity.

BACKGROUND

Static random access memories (SRAMs) have less storage capacity but higher operating speed than dynamic random access memories (DRAMs). Therefore, SRAMs have been widely used in cache memories of computers and various portable electronic appliances that require high operating speeds.

SRAM cells may be classified into thin film transistor (TFT) cells and full complementary metal-oxide semiconductor (FCMOS) cells. A FCMOS cell includes a plurality of pull-up transistors and a plurality of pull-down transistors that constitute a latch, as well as a plurality of transistors that access the latch.

As the integration density of semiconductor memory devices increases, the size of the memory cells in the device decrease, which results in a decrease in the size of the metal contacts. However, as the size of metal contacts decreases, it becomes more difficult to accurately pattern metal contacts, and, thus, the frequency of defects in the fabrication of metal contacts increases. In particular, a pair of adjacent contacts in an SRAM cell may be electrically connected or bridged. As is known to those of skill in the art, certain contacts in a highly integrated SRAM device may have a longitudinal axis and a latitudinal axis, and may be disposed close to one another along the direction of the longitudinal axis. Thus, these adjacent contacts may be unintentionally electrically connected during fabrication of the SRAM device.

As a result, it may be useful to test an SRAM device to determine whether there is a bridge between contacts in SRAM cells. An SRAM device may be tested using defect inspection tools which mostly are optical equipment. However, it may take a considerable amount of time to test an SRAM device, and, thus, productivity may be reduced.

SUMMARY

According to some embodiments of the present invention, test apparatus are provided that include a plurality of pairs of test contacts on a semiconductor substrate, where one contact of each of the pairs of test contacts is adjacent to the other contact of the pair. The test apparatus further includes a first test structure which comprises a plurality of first test interconnection layers and a first body interconnection layer that is electrically connected to each of the first test interconnection layers, where each of the first test interconnection layers is electrically connected to at least one test contact. The test apparatus further includes a second test structure which comprises a plurality of second test interconnection layers and a second body interconnection layer that is electrically connected to the second test interconnection layers, where each of the second test interconnection layers is electrically connected to at least one test contact.

In these test apparatus, one of the first test interconnection layers may be connected to one of the test contacts of each of the pairs of test contacts, and one of the second test interconnection layers may be connected to the other of test contacts of each of the pairs of test contacts. Moreover, the test apparatus may also include a current-measurement module that is electrically connected to the second test structure, and this current-measurement module may be configured to determine whether there is a bridged pair of test contacts by determining whether a current flows between the first test structure and the second test structure. The pairs of test contacts may have a longitudinal axis and a latitudinal axis, and one of the test contacts of each of the pairs of test contacts may be adjacent to the other of the test contacts of the pair in the direction of the longitudinal axis. The first test interconnection layers and the second test interconnection layers may extend in the direction of the latitudinal axis. Additionally, in some embodiments, each of the first test interconnection layers and the second test interconnection layers may be electrically connected to two test contacts.

Pursuant to further embodiments of the present invention, test apparatus are provided that include a semiconductor substrate and a first test gate line and a second test gate line that are generally parallel to each other and that extend in a first direction on the semiconductor substrate. The test apparatus also includes a first test contact on an end portion of the first test gate line and a second test contact on an end portion of the second gate line. The test apparatus also includes a first test interconnection structure which is on and electrically connected to the first test contact and a second test interconnection structure which is on and electrically connected to the second test contact. The test apparatus also includes a current-measurement circuit which is configured to supply a current to the first test interconnection structure and to determine whether the first and second test contacts are short-circuited by determining whether the supplied current is detected in the second test interconnection structure.

Pursuant to still further embodiments of the present invention, test apparatus are provided that include a plurality of pairs of test gate lines on a semiconductor substrate. One gate line of each of the pairs of test gate lines is adjacent to the other gate line of the pair. The test apparatus further includes a plurality of pairs of test contacts on one end portion of the respective pairs of test gate lines, where each of the test contacts have a longitudinal axis and a latitudinal axis, one of each of the pairs of test contacts being adjacent to the other in the direction of the longitudinal axis. The test apparatus also includes a first test structure which comprises a plurality of first test interconnection layers and a first body interconnection layer that is electrically connected to the first test interconnection layers, where each of the first test interconnection layers is electrically connected to at least one test contact. The test apparatus also includes a second test structure which comprises a plurality of second test interconnection layers and a second body interconnection layer that is electrically connected to the second test interconnection layers, where each of the second test interconnection layers is electrically connected to at least one test contact. The pairs of gate lines and the pairs of test contacts are in a test region of the semiconductor substrate which has the same gate line and contact structure as an SRAM cell region that is provided in a different portion of the semiconductor substrate. These test apparatus may be used to determine whether there is a bridged pair of test contacts by determining whether a current flows between the first test structure and the second test structure.

According to further embodiments of the present invention, semiconductor IC devices are provided that include a semiconductor substrate having an SRAM cell region and a test region. The IC device also includes a plurality of pairs of gate lines which are formed in the SRAM cell region, one gate line of each of the pairs of gate lines being adjacent to the other gate line of the pair. The IC device also includes a plurality of contacts on one end portions of the respective pairs of gate lines and a plurality of pairs of test gate lines which are formed in the test region and respectively correspond to the pairs of gate lines. A plurality of pairs of test contacts are provided in the test region and respectively correspond to the pairs of contacts. A first test structure is provided that includes a plurality of first test interconnection layers and a first body interconnection layer that is electrically connected to the first test interconnection layers, where each of the first test interconnection layers is electrically connected to at least one test shared contact. Finally, the IC device includes a second test structure which comprises a plurality of second test interconnection layers and a second body interconnection layer that is electrically connected to the second test interconnection layers, where each of the second test interconnection layers is electrically connected to at least one test contact.

Pursuant to still further embodiments of the present invention, static random access memory devices are provided that include a memory cell region that comprises a plurality of memory cells and a test region. The test region includes a first test contact and a second test contact that are located adjacent to each other to form a first pair of test contacts. The test region further includes a first conductive structure that is connected to the first test contact and a second conductive structure that is connected to the second test contact. The test region also includes a first circuit that is configured to supply a current to the first conductive structure and a second circuit that is configured to detect if the current that is supplied to the first conductive structure flows to the second conductive structure.

Methods of testing static random access memory devices are also provided. Pursuant to some of these methods, a current is applied to a first conductive test structure of the SRAM device that is electrically connected to a first test contact of each of a plurality of pairs of test contacts. If a current flows through a second conductive test structure of the SRAM device that is electrically connected to at least some of the second test contacts of the plurality of pairs of test contacts in response to the application of the current to the first conductive test structure, it is determined that at least one of the pairs of test contacts is short-circuited.

In these methods, the first and second test structures and the plurality of pairs of test contacts may be in a test region of the static random access memory device, and the static random access memory device may further include a memory cell region that includes pairs of memory cell contacts that are formed using the same processing steps that are used to form the plurality of pairs of test contacts. Moreover, the first test structure may comprise a plurality of first test conductive lines that are connected to a first body conductive line, and the second test structure may comprise at least one second test conductive line. A current-measurement module may be electrically connected to the at least one second test conductive line. Each pair of test contacts may extend side-by-side in a first direction, the first body conductive line may extend in the first direction, and the first and second test conductive lines may extend in a second direction that is substantially parallel to the first direction.

BRIEF DESCRIPTION OF THE DRAWINGS

The above and other features and advantages of the present invention will become apparent by describing in detail embodiments thereof with reference to the attached drawings in which:

FIGS. 4A through 5B are plan and cross-sectional diagrams of portions of a test apparatus according to embodiments of the present invention.

DETAILED DESCRIPTION

The present invention will now be described more fully with reference to the accompanying drawings, in which embodiments of the invention are shown. The invention may, however, be embodied in many different forms and should not be construed as being limited to the embodiments set forth herein. Rather, these embodiments are provided so that this disclosure will be thorough and complete, and will fully convey the concepts of the invention to those skilled in the art.

It should be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers refer to like elements throughout. As used herein the term "and/or" includes any and all combinations of one or more of the associated listed items.

It should be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of the invention. As used herein, the singular forms "a," "an" and "the" are intended to include the plural forms as well unless the context clearly indicates otherwise. It will be further understood that the terms "comprises" and/or "comprising" as well as "includes" and/or "including," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Furthermore, relative terms such as "below," "beneath," "lower," "above," and "upper" may be used herein to describe one element's relationship to another element as illustrated in the accompanying drawings. It will be understood that relative terms are intended to encompass different orientations of the device in addition to the orientation depicted in the accompanying drawings. For example, if the device in the accompanying drawings is turned over, elements described as being on the "lower" side of other elements would then be oriented on "upper" sides of the other elements. Similarly, if the device in one of the figures is turned over, elements described as "below" or "beneath" other elements would then be oriented "above" the other elements. Therefore, the exemplary terms "below" and "beneath" can, therefore, encompass both an orientation of above and below.

A semiconductor integrated circuit (IC) device according to certain embodiments of the present invention includes a static random access memory (SRAM) cell region and a test region which are both defined on a semiconductor substrate. It will be appreciated that the semiconductor substrate may be a conventional semiconductor substrate, a semiconductor-on-insulator substrate, a semiconductor epitaxial layer, etc.

The structure of an SRAM cell region of a semiconductor IC device according to certain embodiments of the present invention will hereinafter be described in detail with reference to FIGS. 1 and 2.

Figure 1:
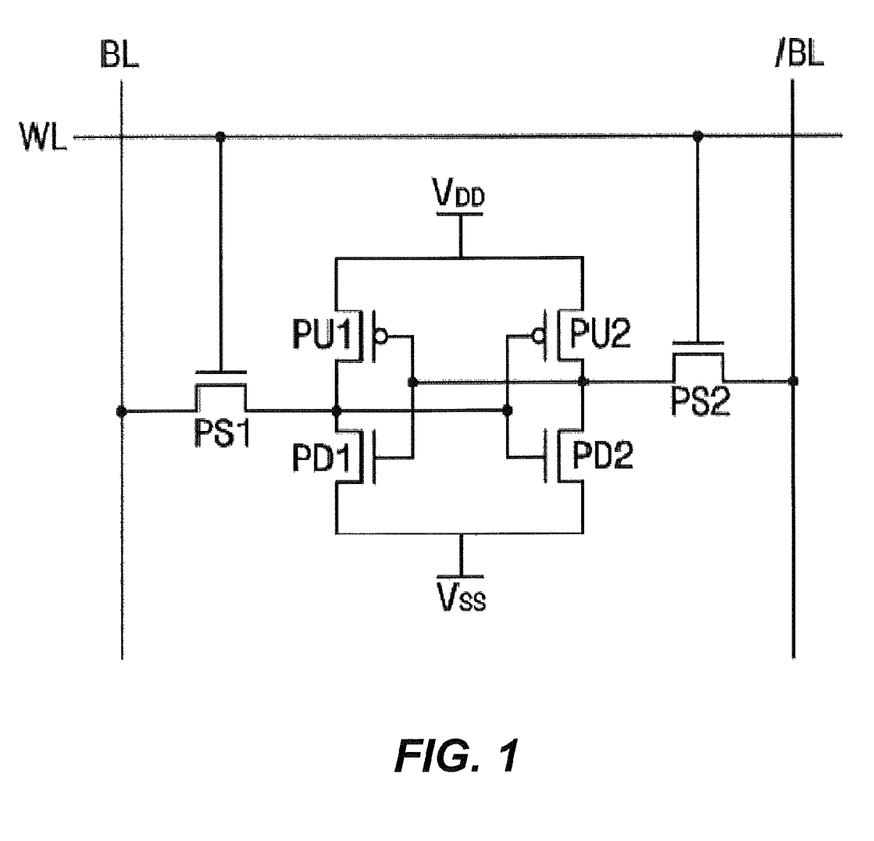
FIG. 1 is a circuit diagram of a static random access memory (SRAM) cell of a semiconductor integrated circuit (IC) device according to certain embodiments of the present invention.

FIG. 1 is a circuit diagram of an SRAM cell of a semiconductor IC device. As shown in FIG. 1, the SRAM cell includes first and second pull-up transistors PU1 and PU2, first and second pull-down transistors PD1 and PD2, and first and second pass transistors PS1 and PS2. The first and second pull-up transistors PU1 and PU2 and the first and second pull-down transistors PD1 and PD2 constitute a latch, and the first and second pass transistors PS1 and PS2 are used to access the latch.

In the SRAM cells of FIG. 1, the first and second pass transistors PS1 and PS2 and the first and second pull-down transistors PD1 and PD2 are N-channel metal oxide semiconductor (NMOS) transistors, and the first and second pull-up transistors PU1 and PU2 are P-channel metal oxide semiconductor (PMOS) transistors.

The sources of the first and second pull-down transistors PD1 and PD2 are both connected to a first reference voltage (a ground voltage VSS in the embodiment of FIG. 1), and the sources of the first and second pull-up transistors PU1 and PU2 are both connected to a second reference voltage (a power supply voltage VDD in the embodiment of FIG. 1).

The first pull-down transistor PD1 and the first pull-up transistor PU1 constitute a first inverter. The second pull-down transistor PD2 and the second pull-up transistor PU2 constitute a second inverter. Output ports of the first and second inverters are respectively connected to the sources of the first and second pass transistors PS1 and PS2. In order to constitute a single latch circuit, the output ports of the first and second inverters may be cross-connected to input ports of the first and second inverters. The drains of the first and second pass transistors PS1 and PS2 are connected to first and second bitlines BL and /BL, respectively.

Figure 2:
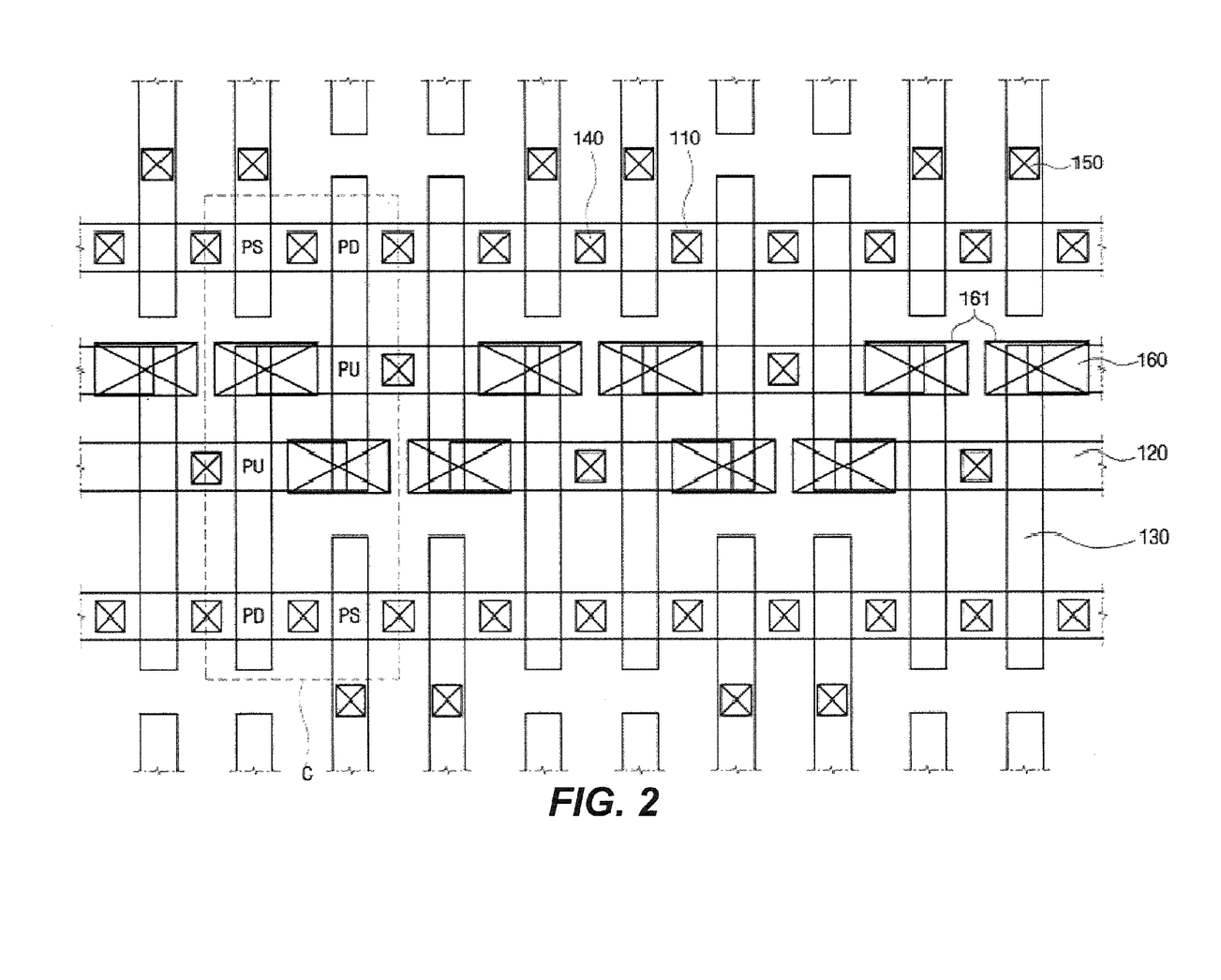
FIG. 2 is a plan view of an SRAM cell region of a semiconductor IC device according to embodiments of the present invention.

FIG. 2 is a plan view of an SRAM cell region of a semiconductor IC device according to certain embodiments of the present invention. Referring to FIG. 2, the SRAM cell region includes a plurality of first conductivity type active regions 110 and a plurality of second conductivity type active regions 120 which may be a predetermined distance apart from the respective first conductivity type active regions 110. The length of the second conductivity type active regions 120 may be less than the length of the first conductivity type active regions 110. The first conductivity type active regions 110 may be N-type active regions, and the second conductivity type active regions 120 may be P-type active regions.

The SRAM cell region includes a plurality of gate lines 130 which intersect the first conductivity type active regions 110 and/or the second conductivity type active regions 120. The gate lines 130 may extend in a first direction in parallel with one another. The gate lines 130 partially overlap the first conductivity type active regions 110 and/or the second conductivity type active regions 120, thereby forming transistors. Transistors formed in the overlapping areas of the gate lines 130 and the first conductivity type active regions 110 may be N-type transistors (e.g., pull-down transistors or pass transistors), and transistors formed in the overlapping areas of the gate lines 130 and the second conductivity type active regions 120 may be P-type transistors (e.g., pull-up transistors). In FIG. 2, an SRAM cell C which includes six transistors (which are labeled PS, PD or PU) is outlined by the dotted lines.

Source/drain regions are formed on both sides of each of the overlapping areas of the gate lines 130 and either the first conductivity type active regions 110 or the second conductivity type active regions 120. A plurality of first contacts 140 are formed over certain of the source/drain regions. The first contacts 140 connect the source/drain regions and upper interconnections of the SRAM device. A plurality of second contacts 150 are formed on some of the gate lines 130. A voltage may be applied to a gate line 130 through a second contact 150.

A plurality of pairs 161 of third contacts 160 may also be formed. Each of the third contacts 160 in the plurality of pairs 161 is formed where a second conductivity type active region 120 overlaps one end portion of a gate line 130. As shown in FIG. 2, the two third contacts 160 that comprise each pair 161 may be closely located, and each third contact 160 may have a longitudinal axis and a latitudinal axis. The two third contacts 160 of each of the pair 161 may be adjacent to each other in the direction of the longitudinal axis.

A plurality of silicide regions may be formed on portions of the first and second conductivity type active regions 110 and 120 that are not overlapped by the gate lines 130 and on the gate lines 130. The silicide regions may reduce the contact resistance of the first contacts 140, the second contacts 150 and the shared contacts 160.

The structure of a test region of a semiconductor IC device according to embodiments of the present invention will hereinafter be described in detail with reference to FIGS. 2 and 3. The test region may be a test apparatus.

Figure 3:
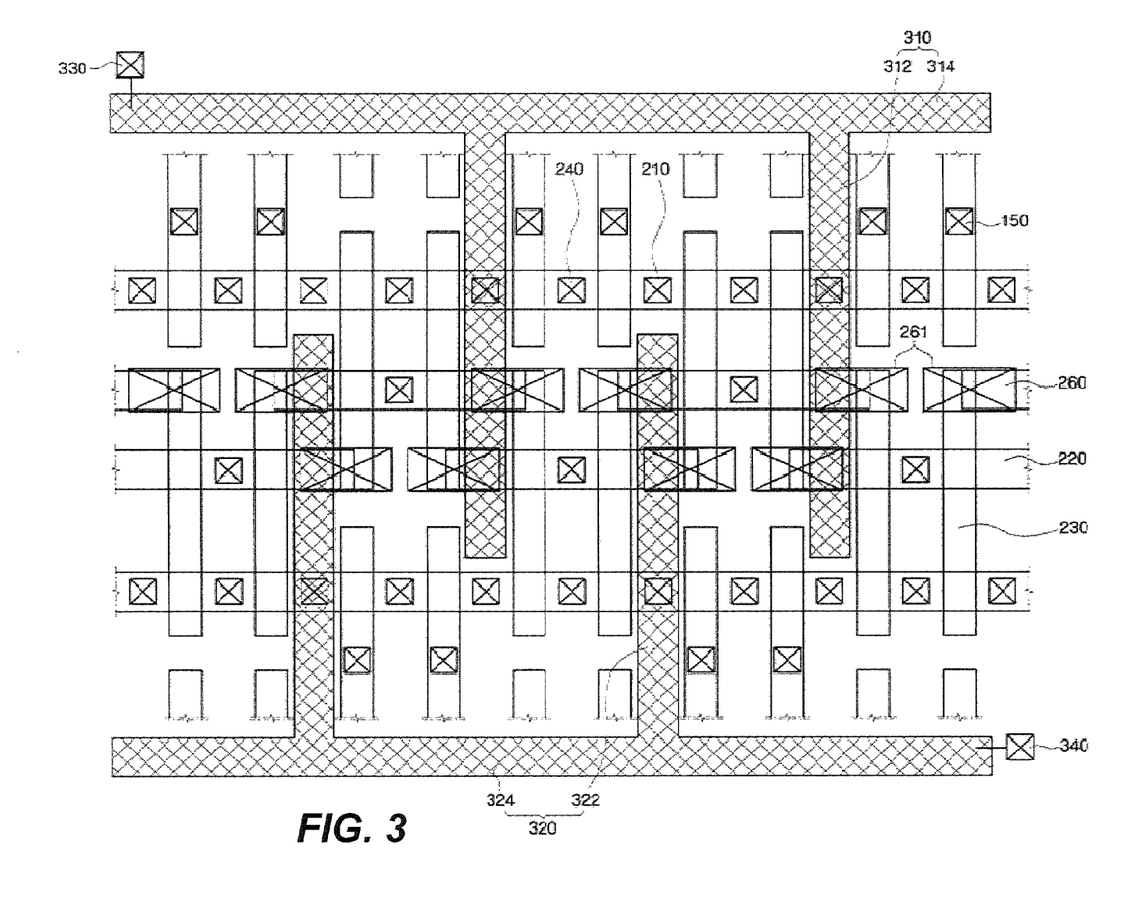
FIG. 3 is a plan view of a test region of a semiconductor IC device according to embodiments of the present invention.

FIG. 3 is a plan view of a test region of a semiconductor IC device according to certain embodiments of the present invention. Referring to FIG. 3, the test region has almost the same layout as the SRAM cell region illustrated in FIG. 2.

That is, the test region includes a plurality of first test active regions 210 and a plurality of second test active regions 220. The first test active regions 210 may have the same size and the same pattern of arrangement as the first conductivity type active region 110 illustrated in FIG. 2, and the second test active regions 220 may have the same size and the same pattern of arrangement as the second conductivity type active region 120 illustrated in FIG. 2. Thus, the first test active regions 210 may correspond to the first conductivity type active regions 110, and the second test active regions 220 may correspond to the second conductivity type active regions 120.

The test region also includes a plurality of pairs of test gate lines 230 which extend in the first direction in parallel with each other and intersect the first test active regions 210 and the second test regions 220. The pairs of test gate lines 230 correspond to respective corresponding pairs of gate lines 130 illustrated in FIG. 2.

A plurality of pairs 261 of test shared contacts 260 are formed on one end portions of the respective pairs of test gate lines 230. The pairs 261 of test shared contacts 260 correspond to the respective pairs 161 of shared contacts 160. The pairs 261 of test shared contacts 260 have a longitudinal axis and a latitudinal axis. One contact 260 of each of the pairs 261 of test shared contacts 260 may be adjacent to the other contact 260 of the pair in the direction of the longitudinal axis. A plurality of first test contacts 240 respectively corresponding to the first contacts 140 and a plurality of second test contacts 250 respectively corresponding to the second contacts 150 may also be formed in the test region.

The test region may also include a first test structure 310 and a second test structure 320. The first test structure 310 and the second test structure 320 may be electrically connected to some of the test shared contacts 260.

The first test structure 310 includes a plurality of first test interconnection layers 312 which extend in the first direction. The first test interconnection layers 312 are separated from one another in a second direction. Each of the first test interconnection layers 312 may be electrically connected to at least one test shared contact 260. Specifically, each of the first test interconnection layers 312 may be connected to only one test shared contact 260 of a pair 261 of test shared contacts 260, and is not connected to the other test shared contact 260 of the pair 261 of test shared contacts 260.

The first structure 310 also includes a first body interconnection layer 314 to which each first test interconnection layer 312 is connected. The first body interconnection layer 314 may extend in the second direction and a first end of each first test interconnection layer 312 may be connected to the first body interconnection layer 314. Thus, when a current flows into the first body interconnection layer 314, a current also flows into test shared contacts 260 through the first test interconnection layers 312. If only one first test interconnection layer 312 is provided, the first body interconnection layer 314 may be optional. In this case, an input pad 330 may be directly connected to the first test interconnection layer 312.

The second test structure 320 may include a plurality of second test interconnection layers 322 which extend in the first direction. The second test interconnection layers 322 may be separated from one another in the second direction. Each of the second test interconnection layers 322 may be connected to at least one test shared contact 260. Specifically, the second test interconnection layers 322 may be connected to the test shared contacts 260 to which the first test interconnection layers 312 are not connected. Thus, one test shared contact 260 of a pair 261 of test shared contacts 260 may be connected to a first test interconnection layer 312, and the other test shared contact 260 of the pair 261 of test shared contacts 260 may be connected to a second interconnection layer 322.

The second test structure 320 also includes a second body interconnection layer 324 to which each second test interconnection layers 322 is connected. The second body interconnection layer 324 may extend in the second direction and a first end of each second test interconnection layer 322 may be connected to the second body interconnection layer 324. Thus, when a current flows into the second body interconnection layer 324, a current also flows into test shared contacts 260 through the second test interconnection layers 322. If only one second test interconnection layer 322 is provided, the second body interconnection layer 324 may be optional and connections may be made directly to the second test interconnection layer 322.

Referring to FIG. 3, first and second current-measurement modules 330 and 340 may be formed in the test region. The first current-measurement module 330 directs current into the first test structure 310 or detects a current flowing in the first test structure 310. The second current-measurement module 340 directs current into the second test structure 320 or detects a current flowing in the second test structure 320. The first current-measurement module 330 may include an input pad, and the second current-measurement module 340 may include an output pad.

The first and second test structures 310 and 320 and the first and second current-measurement modules 330 and 340 may determine whether there is a bridged pair 261 of test shared contacts 260. The first test structure 310 is electrically connected to the pairs 261 of test shared contacts 260 through the first test interconnection layers 312, and the second test structure 320 is electrically connected to the pairs 261 of test shared contacts 260 through the second test interconnection layers 322. Thus, if a bridge occurs in any one of the pairs 261 of test shared contacts 260, a current applied to the first test structure 310 through the input pad 330 may flow into the second test structure 320, and, thus, a variation in the current or voltage of the second test structure 320 may be detected by the second current-measurement module 340. That is, it is possible to determine whether there is a bridged pair 261 of test shared contacts 260 by directing a current into the first test structure 310 and detecting a current, if any, from the second test structure 320 (or vice versa).

Figure 4A:
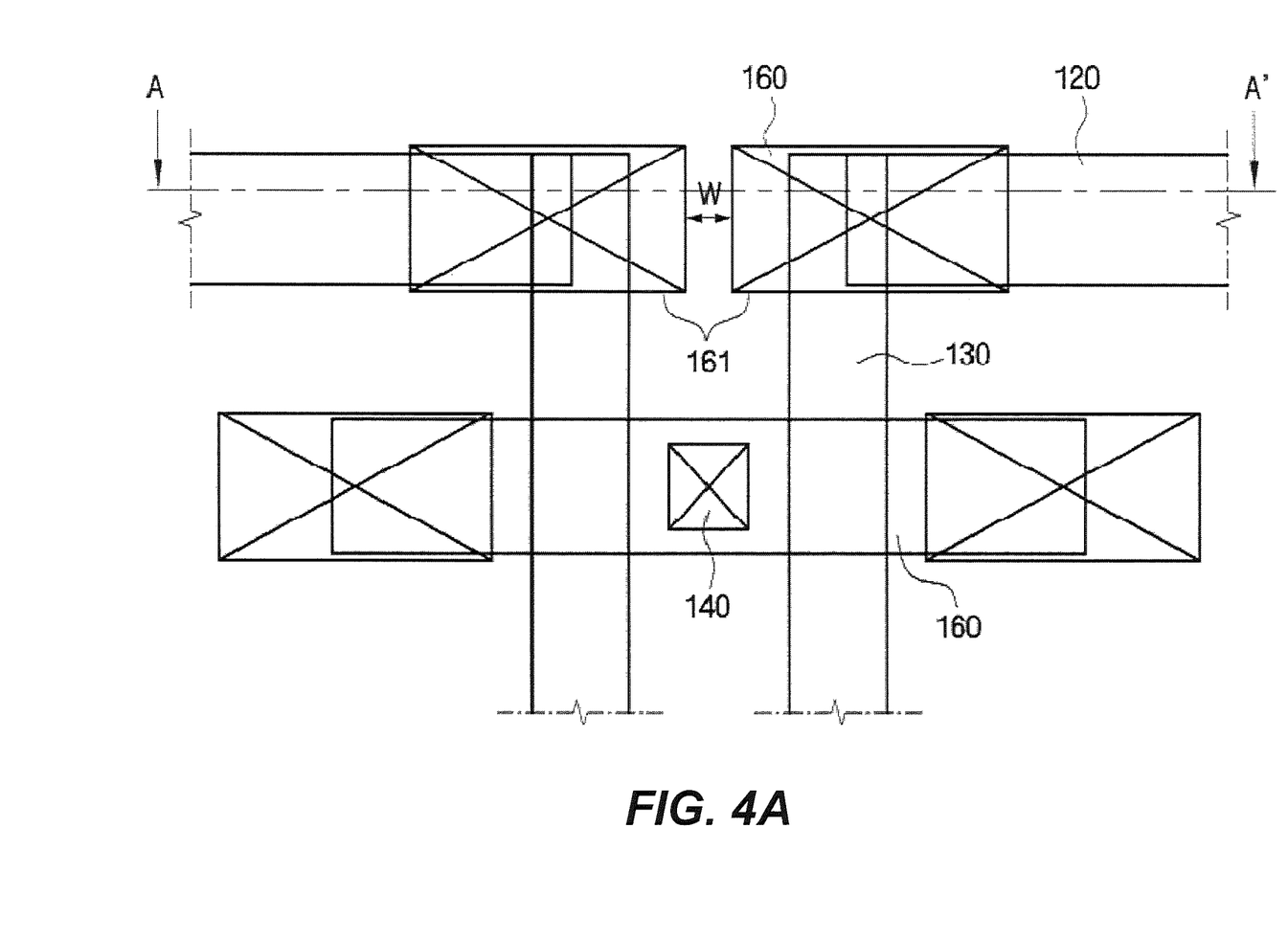
Figure 4B:
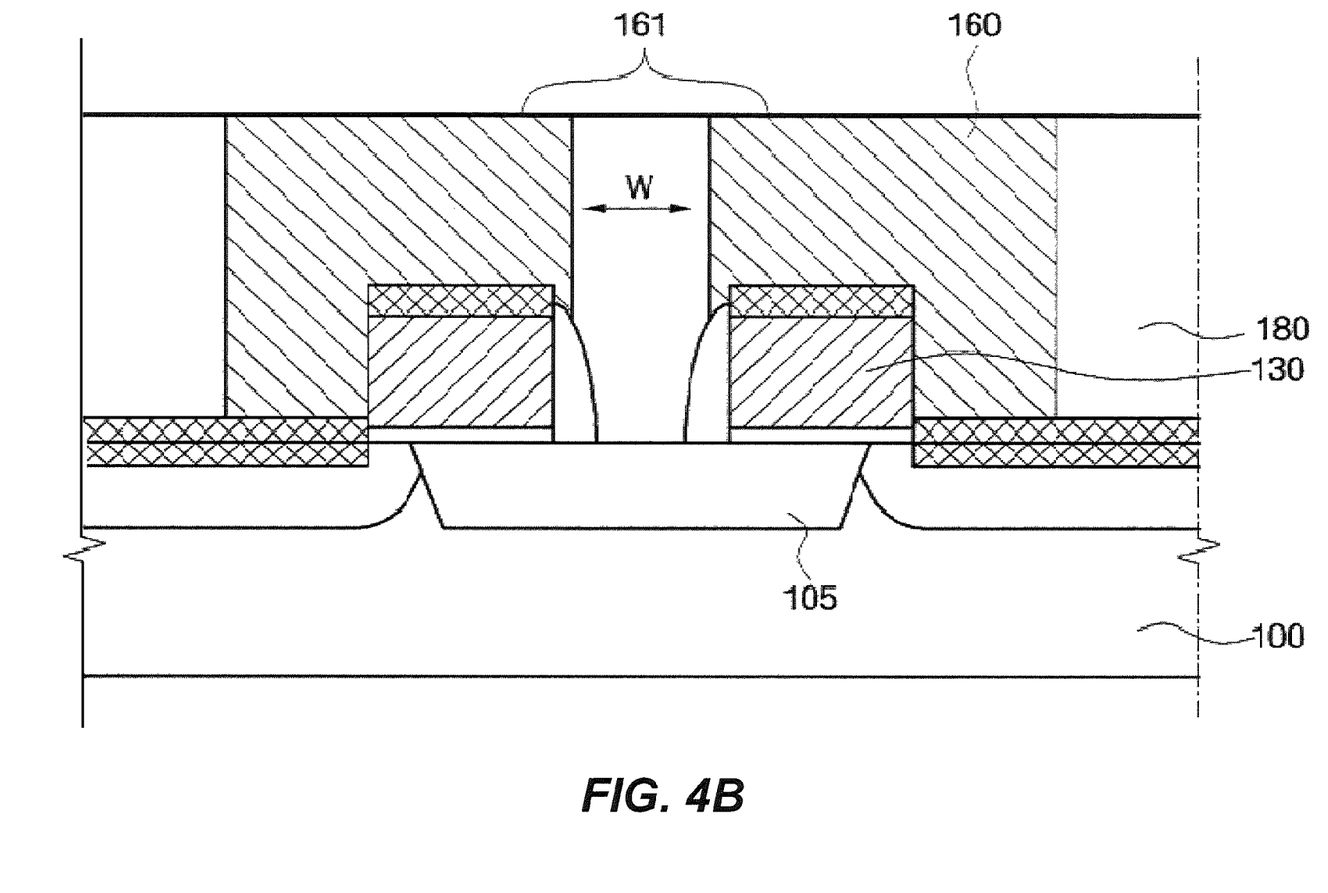
Figure 5A:
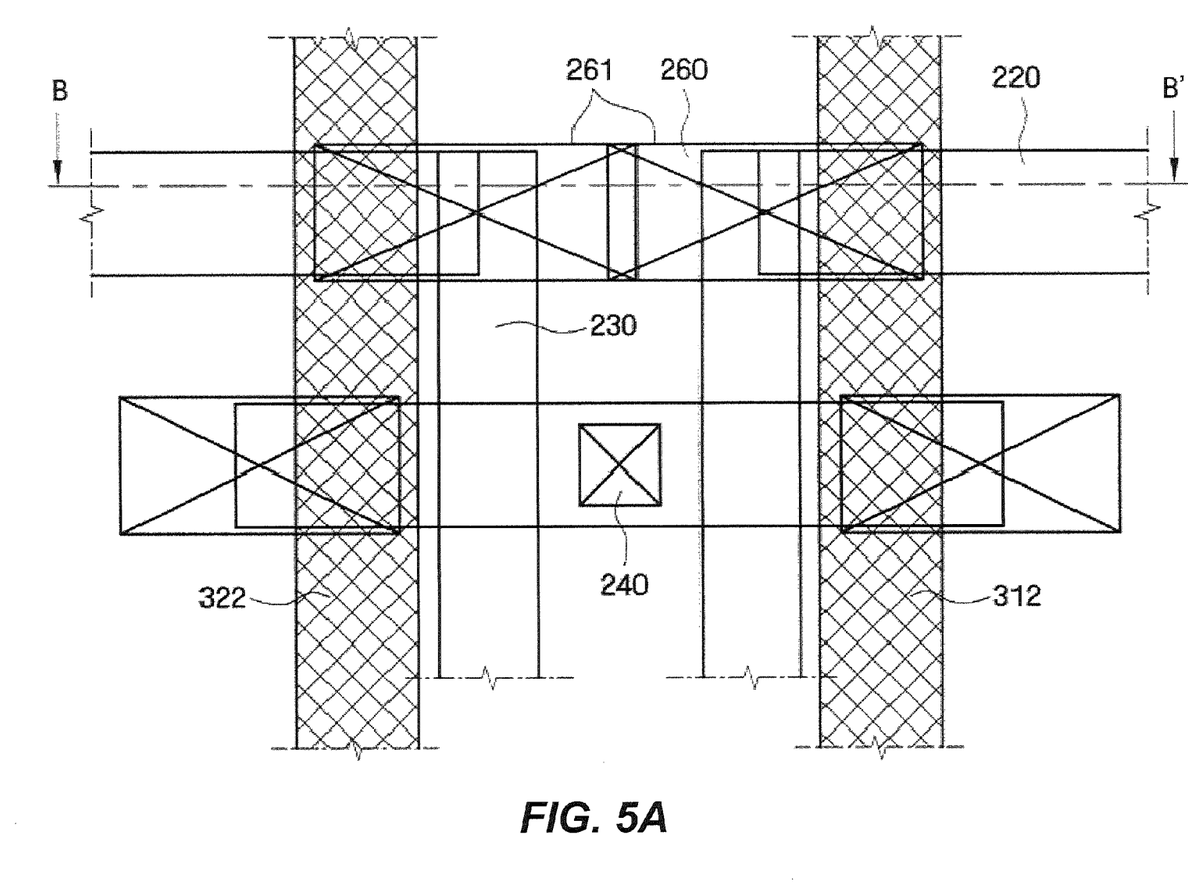
Figure 5B:
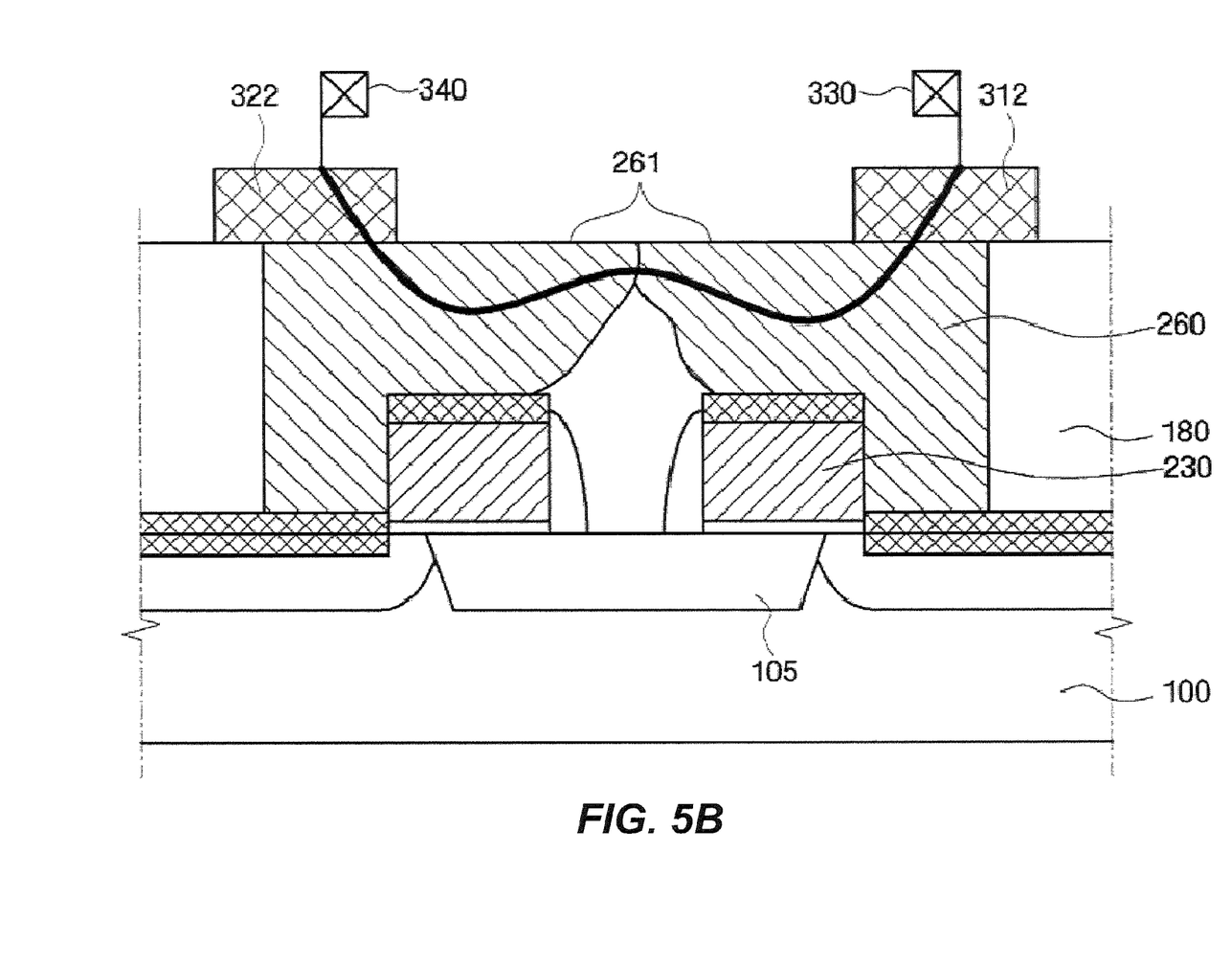

FIGS. 4A through 5B are plan and cross-sectional diagrams of portions of a test apparatus of a semiconductor IC device according to certain embodiments of the present invention. Specifically, FIG. 4A is a plan view of a plurality of shared contacts 160 in an SRAM cell region of a semiconductor IC device, and FIG. 4B is a cross-sectional view taken along line of A-A' of FIG. 4A. FIG. 5A is a plan view of a plurality of test shared contacts 260 in a test region of the semiconductor IC device, and FIG. 5B is a cross-sectional view taken along line of B-B' of FIG. 5A.

Referring to FIGS. 4A and 4B, a plurality of pairs 161 of shared contacts 160 may be formed on a semiconductor substrate 100 in an SRAM cell region of a semiconductor IC device. A pair 161 of shared contacts 160 may be a predetermined distance w apart from each other. Referring to FIGS. 4A and 4B, reference numerals 105 and 180 indicate an isolation region and an interlayer dielectric layer, respectively.

Referring to FIGS. 5A and 5B, a pair 261 of test shared contacts 260 are bridged. In this case, when a current is applied to a first current-measurement module 330 connected to a first test interconnection layer 312, a current variation (or voltage variation) is detected by a second current-measurement module 340 connected to a second text interconnection layer 322. That is, since the pair 261 of test shared contacts 260 are electrically connected, the first test interconnection layer 312 and the second test interconnection layer 322 are also electrically connected.

In this manner, it is possible to easily determine whether the pair 261 of test shared contacts 260 are bridged by applying a current to the first test interconnection layer 312 and measuring the current (or voltage) of the second test interconnection layer 322.

In the present embodiment, it may be determined whether there is a bridged pair 161 of shared contacts 160 in an SRAM cell region of a semiconductor IC device by determining whether there is a bridged pair 261 of test shared contacts 260 in a test region of the semiconductor IC device. In addition, it is determined whether there is a bridged pair 261 of test shared contacts 260 by forming a first test structure 310 and a second test structure 320 and determining whether a current flows into the second test structure 320 when a current flows into the first test structure 310. Therefore, it is possible to easily determine whether the pairs 261 of test shared contacts 260 are bridged and thus to improve productivity.

In the present embodiment, a plurality of test shared contacts 260, which are formed in a test region of a semiconductor IC device, respectively correspond to a plurality of shared contacts 160, which are formed in an SRAM cell region of the semiconductor IC device, and the surroundings of the test shared contacts 260 are the same as the surroundings of the shared contacts 160. Therefore, the test shared contacts 260 can precisely reflect whether the respective shared contacts 160 are bridged. Therefore, it is possible to precisely test a semiconductor IC device and thus to improve productivity.

As described above, according to embodiments of the present invention, it is possible to determine whether there is a bridged pair of contacts in an SRAM cell region of a semiconductor IC device by determining whether there is a bridged pair of test contacts in a test region of the semiconductor IC device. In addition, it is determined whether there is a bridged pair of test contacts in a test region of a semiconductor IC device by forming a first test structure and a second test structure and determining whether a current flows into the second test structure when a current flows into the first test structure. Therefore, it is possible to easily determine whether the pairs of test contacts are bridged and thus to improve productivity.

In addition, according to embodiments of the present invention, a plurality of test contacts, which are formed in a test region of a semiconductor IC device, respectively correspond to a plurality of contacts which are formed in an SRAM cell region of the semiconductor IC device, and the surroundings of the test contacts are generally the same as the surroundings of the contacts. Therefore, the test contacts can precisely reflect whether the respective contacts are bridged. Therefore, it is possible to precisely test a semiconductor IC device and thus to improve productivity.

While the present invention has been particularly shown and described with reference to embodiments thereof, it will be understood by those of ordinary skill in the art that various changes in form and details may be made therein without departing from the spirit and scope of the present invention as defined by the following claims.

What is claimed is:

1. A test apparatus fabricated on a semiconductor substrate, comprising:
a plurality of pairs of test gate lines on the semiconductor substrate, one of each of the pairs of test gate lines being adjacent to the other;
a plurality of pairs of test shared contacts on the semiconductor substrate, one shared contact of each of the pairs of test shared contacts being adjacent to the other shared contact of the pair, wherein the test shared contacts of the each plurality of pairs of test shared contacts are on respective end portions of the respective pairs of test gate lines;
a first test structure which comprises a plurality of first test interconnection layers and a first body interconnection layer that is electrically connected to each of the first test interconnection layers, each of the first test interconnection layers being electrically connected to at least one test shared contact; and
a second test structure which comprises a plurality of second test interconnection layers and a second body interconnection layer that is electrically connected to the second test interconnection layers, each of the second test interconnection layers being electrically connected to at least one test shared contact.

2. The test apparatus of claim 1, wherein one of the first test interconnection layers is connected to one of the test shared contacts of each of the pairs of test shared contacts, and one of the second test interconnection layers is connected to the other of test shared contacts of each of the pairs of test shared contacts, and wherein each test gate line is electrically connected to a respective one of the test shared contacts.

3. The test apparatus of claim 1, further comprising a current measurement circuit fabricated on the semiconductor substrate that is electrically connected to the second test structure, wherein the current-measurement circuit is configured to determine whether there is a bridged pair of test shared contacts by determining whether a current flows between the first test structure and the second test structure.

4. The test apparatus of claim 1, wherein the pairs of test shared contacts have a longitudinal axis and a latitudinal axis, wherein one of the test shared contacts of each of the pairs of test shared contacts is adjacent to the other of the test shared contacts of the pair in the direction of the longitudinal axis, and wherein the first test interconnection layers and the second test interconnection layers extend in the direction of the latitudinal axis and the first body interconnection layer and the second body interconnection layer each extend in the direction of the longitudinal axis.

5. The test apparatus of claim 4, wherein each of the first test interconnection layers and the second test interconnection layers is electrically connected to two test shared contacts.

6. The test apparatus of claim 1, wherein a static random access memory (SRAM) cell region and a test region are defined on the semiconductor substrate, and the pairs of test shared contacts, the first test structure and the second test structure are all within the test region.

7. The test apparatus of claim 6, wherein a plurality of pairs of shared contacts are formed in the SRAM cell region and respectively correspond to the pairs of test shared contacts.

8. A test apparatus fabricated on a semiconductor substrate comprising:
a first test gate line and a second test gate line fabricated on the semiconductor substrate that are substantially parallel to each other and that extend in a first direction on the semiconductor substrate;
a first test contact on an end portion of the first test gate line;
a second test contact on an end portion of the second test gate line;
a first test interconnection structure which is on and electrically connected to the first test contact, wherein the first test structure comprises a plurality of first test interconnection layers fabricated on the semiconductor substrate that are electrically connected to at least one test contact, the first test interconnection layers being substantially parallel to the first test gate line;
a second test interconnection structure which is on and electrically connected to the second test contact, wherein the second test structure comprises a plurality of second test interconnection layers fabricated on the semiconductor substrate that are electrically connected to at least one test contact, the second test interconnection layers being substantially parallel to the second test gate line; and
a current-measurement circuit fabricated on the semiconductor substrate, which is configured to supply a current to the first test interconnection structure and to determine whether the first and second test contacts are short-circuited by determining whether the supplied current is detected in the second test interconnection structure.

9. The test apparatus of claim 8, wherein the first and second test contacts each have a longitudinal axis and a latitudinal axis and are adjacent to each other in the direction of their respective longitudinal axes, and wherein the first test interconnection structure and the second test interconnection structure extend in the direction of the latitudinal axis.

10. The test apparatus of claim 8, wherein an SRAM cell region and a test region are defined on the semiconductor substrate, and the first and second test contacts, the first test interconnection structure and the second test interconnection structure are all formed in the test region, and wherein first and second contacts are formed in the SRAM cell region that respectively correspond to the first and second test contacts.

11. A test apparatus fabricated on a semiconductor substrate comprising:
a plurality of pairs of test gate lines fabricated on the semiconductor substrate, one of each of the pairs of test gate lines being adjacent to the other;
a plurality of pairs of test shared contacts on one end portion of the respective pairs of test gate lines, each of the test shared contacts having a longitudinal axis and a latitudinal axis, one of each of the pairs of test shared contacts being adjacent to the other in the direction of the longitudinal axis;
a first test structure which comprises a plurality of first test interconnection layers that are fabricated on the semiconductor substrate and a first body interconnection layer fabricated on the semiconductor substrate that is electrically connected to the first test interconnection layers, each of the first test interconnection layers being electrically connected to at least one test shared contact; and
a second test structure which comprises a plurality of second test interconnection layers that are fabricated on the semiconductor substrate and a second body interconnection layer fabricated on the semiconductor substrate that is electrically connected to the second test interconnection layers, each of the second test interconnection layers being electrically connected to at least one test shared contact,
wherein the pairs of gate lines and the pairs of test shared contacts are in a test region of the semiconductor substrate which has the same gate line and contact structure as an SRAM cell region that is provided in a different portion of the semiconductor substrate, and
wherein it is determined whether there is a bridged pair of test shared contacts by determining whether a current flows between the first test structure and the second test structure.

12. A semiconductor integrated circuit (IC) device comprising:
a semiconductor substrate having an SRAM cell region and a test region;
a plurality of pairs of gate lines which are formed in the SRAM cell region, one gate line of each of the pairs of gate lines being adjacent to the other gate line of the pair;
a plurality of shared contacts which are formed on one end portions of the respective pairs of gate lines;
a plurality of pairs of test gate lines which are formed in the test region and respectively correspond to the pairs of gate lines;
a plurality of pairs of test shared contacts which are formed on one end portions of the respective pairs of test gate lines, where a first test shared contact of each pair of test shared contacts is directly adjacent to a second test shared contact of each pair of test shared contacts;
a first test structure which comprises a plurality of first test interconnection layers and a first body interconnection layer that is electrically connected to the first test interconnection layers, each of the first test interconnection layers being electrically connected to at least one test shared contact; and
a second test structure which comprises a plurality of second test interconnection layers and a second body interconnection layer that is electrically connected to the second test interconnection layers, each of the second test interconnection layers being electrically connected to at least one test shared contact.

13. The semiconductor IC device of claim 12, further comprising a current-measurement circuit which is configured to determine whether there is a bridged pair of test shared contacts by determining whether a current flows between the first test structure and the second test structure.

14. The semiconductor IC device of claim 12, wherein the pairs of test shared contacts have a longitudinal axis and a latitudinal axis, wherein one of each of the pairs of test shared contacts is adjacent to the other in the direction of the longitudinal axis, and wherein the first test interconnection layers and the second test interconnection layers are aligned in the direction of the latitudinal axis and the first body interconnection layer and the second body interconnection layer each extend in the direction of the longitudinal axis.

15. The semiconductor IC device of claim 14, wherein each of the first test interconnection layers and the second test interconnection layers is electrically connected to two test shared contacts.

16. The semiconductor IC device of claim 12, wherein one of the test shared contacts of each pair of test shared contacts is connected to one of the first test interconnection layers, and the other test shared contact of each of the pairs of test shared contacts is connected to one of the second test interconnection layers.

17. The semiconductor integrated circuit device of claim 12, wherein the first and second test structures are formed on the semiconductor substrate.

* * * * *